(12) United States Patent
Yamanaka et al.

(10) Patent No.: US 8,084,836 B2
(45) Date of Patent: Dec. 27, 2011

(54) SEMICONDUCTOR PHOTODETECTOR AND RADIATION DETECTING APPARATUS

(75) Inventors: Tatsumi Yamanaka, Hamamatsu (JP); Masanori Sahara, Hamamatsu (JP); Hideki Fujiwara, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 380 days.

(21) Appl. No.: 11/645,800

(22) Filed: Dec. 27, 2006

(65) Prior Publication Data

US 2008/0149943 A1    Jun. 26, 2008

(30) Foreign Application Priority Data

Dec. 21, 2006 (JP) ................ P2006-344902

(51) Int. Cl.
*H01L 31/06* (2006.01)

(52) U.S. Cl. ........ 257/447; 257/431; 257/443; 257/448; 257/452; 257/457; 257/461; 257/462; 257/E33.001

(58) Field of Classification Search ............ 257/80, 257/461, 463, E31.115, E33.076, 127, 170, 257/409, 447, 452, 457, 460, 462, 465, 484, 257/490, 494, 495, 605, E29.012, E29.013, 257/414, 428, 431, 443, 448, E33.001; 438/57, 438/60, 73, 80
See application file for complete search history.

(56) References Cited

U.S. PATENT DOCUMENTS

| | | | |
|---|---|---|---|
| 5,929,499 A | 7/1999 | Kuhlmann et al. | |
| 6,426,991 B1 | 7/2002 | Mattson et al. | |
| 6,510,195 B1 | 1/2003 | Chappo et al. | |
| 6,747,294 B1* | 6/2004 | Gupta et al. | 257/127 |
| 2002/0164851 A1 | 11/2002 | Wu et al. | |
| 2003/0034496 A1 | 2/2003 | Yoneta et al. | |
| 2004/0061113 A1 | 4/2004 | Jeon et al. | |
| 2005/0082630 A1* | 4/2005 | Yamanaka | 257/461 |
| 2005/0087783 A1 | 4/2005 | Jang | |

(Continued)

FOREIGN PATENT DOCUMENTS

CN         1836331       9/2006

(Continued)

OTHER PUBLICATIONS

T. Rohe, "Sensor Concepts for Pixel Detectors in High Energy Physics," URL: http://www.slac.stanford.edu/econf/C02, Carmel, CA, Sep. 10, 2002, pp. 1-23.

(Continued)

*Primary Examiner* — Ha Tran T Nguyen
*Assistant Examiner* — Suberr Chi
(74) *Attorney, Agent, or Firm* — Drinker Biddle & Reath LLP

(57) ABSTRACT

A photodiode array PD1 comprises an n-type semiconductor substrate one face of which is an incident surface of light to be detected; a plurality of pn junction-type photosensitive regions 3 as photodiodes formed on the side of a detecting surface that is opposite to the incident surface of the semiconductor substrate; and a carrier capturing portion 12 formed between adjacent photosensitive regions 3 from among the plurality of photosensitive regions 3 on the detecting surface side of the semiconductor substrate. The carrier capturing portion 12 has one or plurality of carrier capturing regions 13 respectively including pn-junctions, arranged at intervals. Thereby can be realized a semiconductor photodetector and a radiation detecting apparatus which can favorably restrain crosstalk from occurring.

11 Claims, 15 Drawing Sheets

U.S. PATENT DOCUMENTS

2005/0179053 A1    8/2005    Ezaki et al.

FOREIGN PATENT DOCUMENTS

| | | |
|---|---|---|
| EP | 1 280 207 | 1/2003 |
| EP | 1473553 | 11/2004 |
| EP | 1 677 353 | 7/2006 |
| JP | 3-148869 | 6/1991 |
| JP | 03-148869 | 6/1991 |
| JP | 08-213585 | 8/1996 |
| JP | 11-74553 | 3/1999 |
| JP | 11-289100 | 10/1999 |
| JP | 2001-352094 | 12/2001 |
| JP | 2003-004855 | 1/2003 |
| JP | 2003-007993 | 1/2003 |
| JP | 2003-086826 | 3/2003 |
| JP | 2003-086827 | 3/2003 |
| JP | 2003-232679 | 8/2003 |
| JP | 2003-232858 | 8/2003 |
| JP | 2003-232859 | 8/2003 |
| JP | 2003-232860 | 8/2003 |
| JP | 2003-232861 | 8/2003 |
| WO | 2005/038923 | 4/2005 |
| WO | WO 2006/011274 | 2/2006 |

OTHER PUBLICATIONS

G. Bolla, et al., "Sensor development for the CMS pixel detector," Nuclear Instructions and methods in Physics Research, Section—A: Accelerators, Spectrometers, Detectors and Associated Equipment, Elsevier, Amsterdam, NL., vol. 485, No. 1-2, Jun. 1, 2002, pp. 89-99.

* cited by examiner

Fig.9
(a)
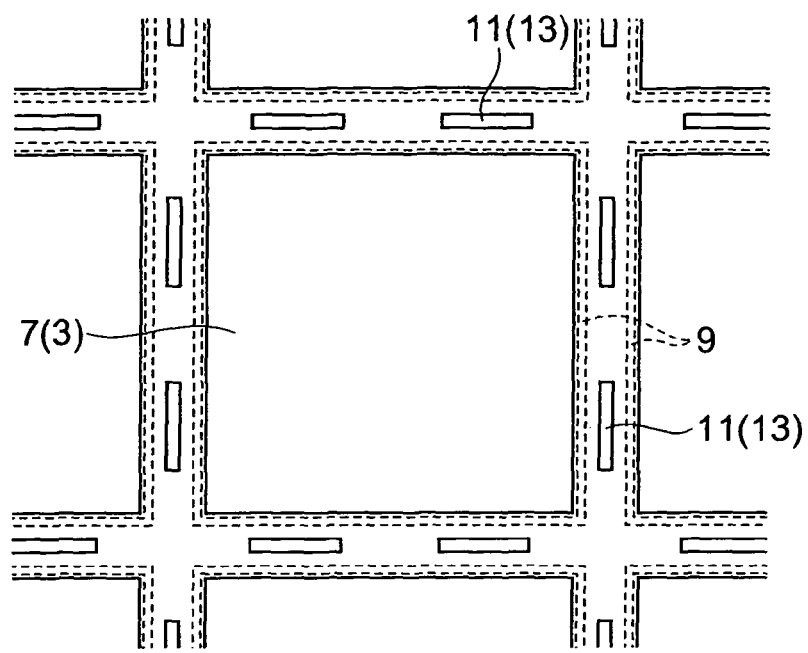
(b)
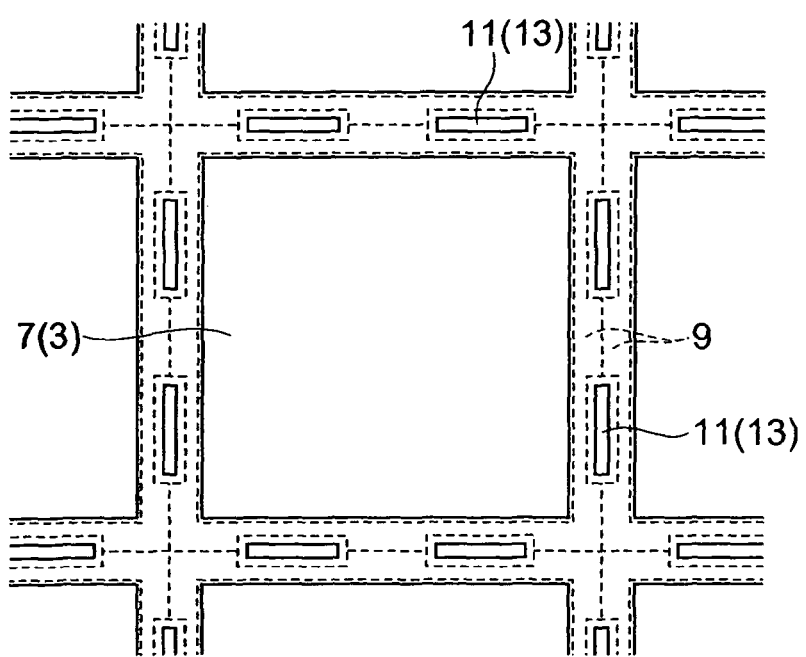

Fig.10
(a)
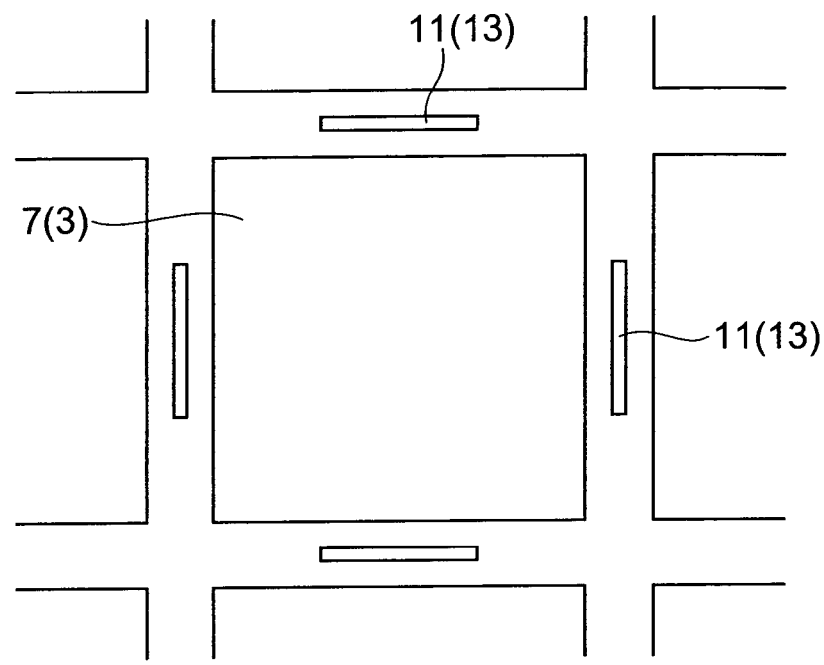
(b)
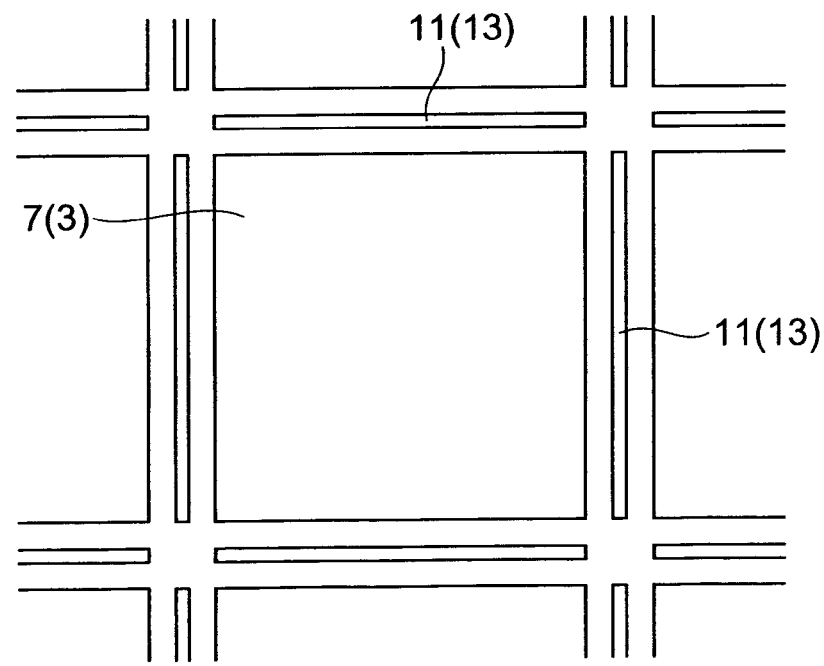

Fig.11
(a)
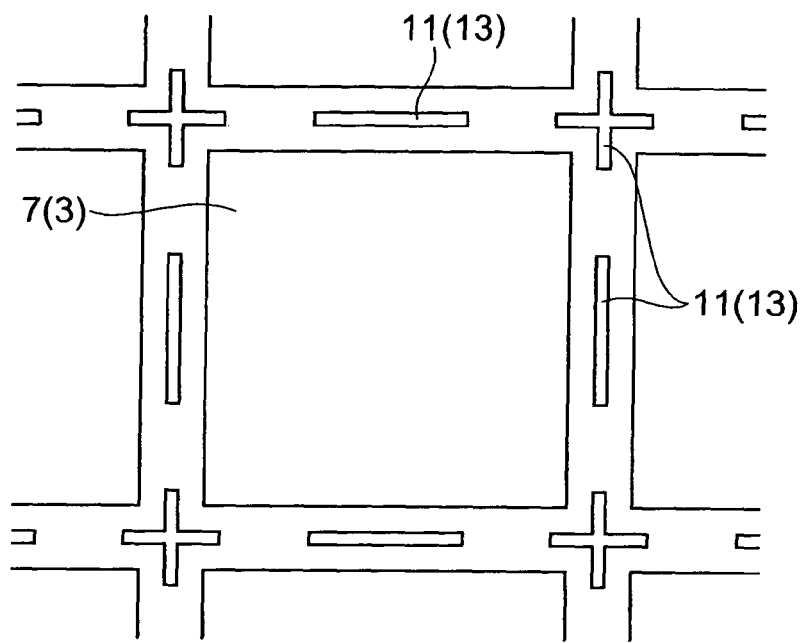
(b)
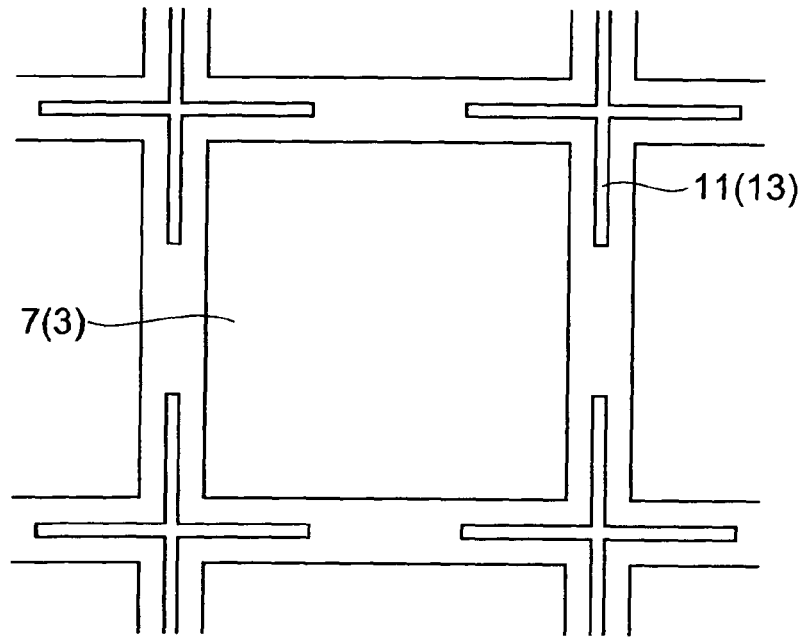

Fig.12
(a)
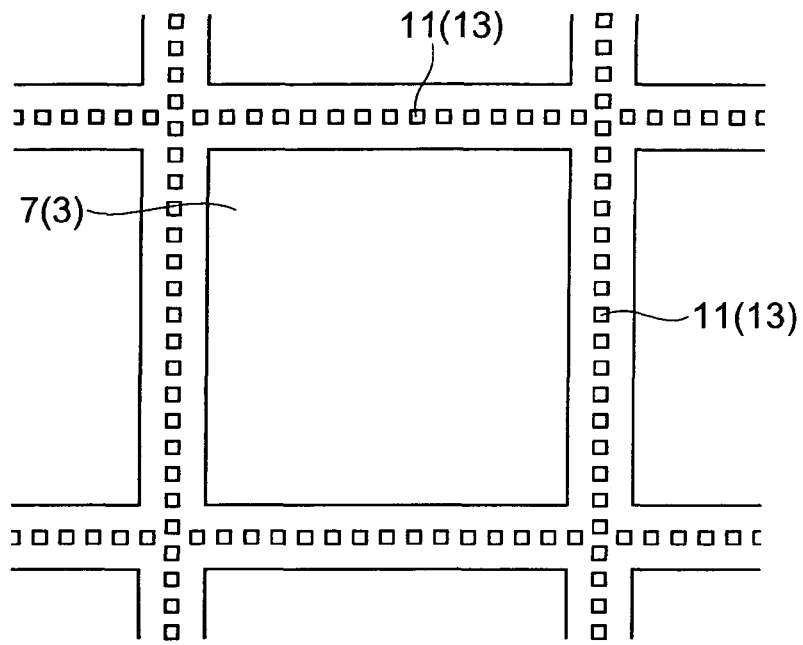
(b)
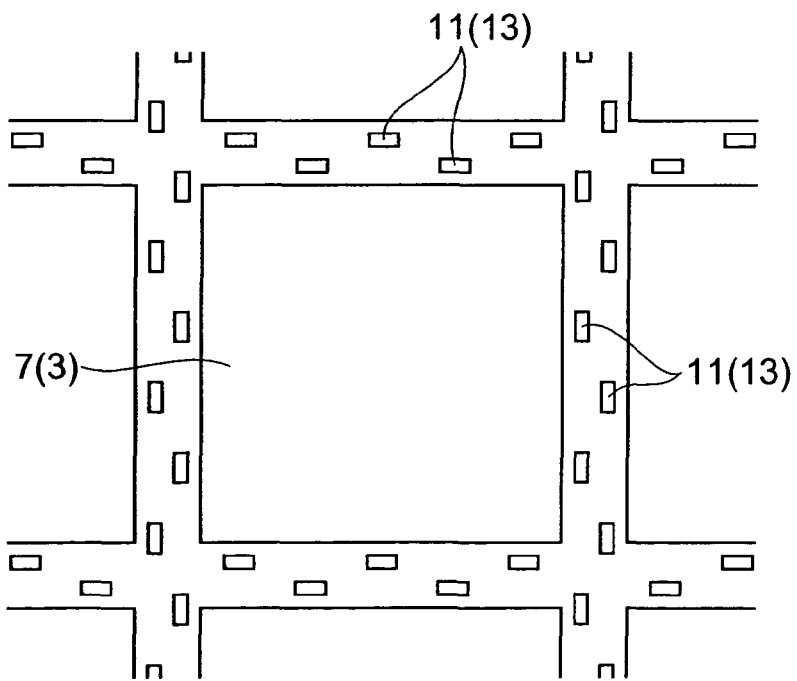

SEMICONDUCTOR PHOTODETECTOR AND RADIATION DETECTING APPARATUS

BACKGROUND OF THE INVENTION

1. Field of the Invention

The present invention relates to a semiconductor photodetector, and to a radiation detecting apparatus comprising the semiconductor photodetector.

2. Related Background Art

Known as the semiconductor photodetector is a backside incident type photodiode array in which a plurality of photodiodes are formed on one surface side of a semiconductor substrate, while the other surface is used as a light incident surface (see, for example, Patent Document 1: Japanese Patent Application Laid-Open No. H11-74553, and Patent Document 2: WO2005/038923).

SUMMARY OF THE INVENTION

In the backside incident type photodiode array, in general, carriers generated in regions other than a depletion layer in the semiconductor substrate migrate by diffusion over a long distance (a distance from the position where they are generated to the depletion layer). Therefore, the probability of carriers generated near between photodiodes flowing into their adjacent photodiodes by diffusion migration without depending on an electric field becomes higher. As a result, crosstalk is more likely to occur between the photodiodes.

Meanwhile, in the backside incident type photodiode array disclosed in the above Document 1, a thin layer for absorbing X-rays is formed between the adjacent photodiodes. However, the thin layer in the Document 1 aims at eliminating scattered X-rays, and does not take account of the above-mentioned crosstalk.

In view of the foregoing, it is an object of the present invention to solve the above-described problems by providing a semiconductor photodetector and radiation detecting apparatus which can favorably restrain crosstalk from occurring.

In order to achieve the above object, the semiconductor photodetector according to the present invention comprises: (1) a semiconductor substrate, one face of which is an incident surface of light to be detected; (2) a plurality of pn junction-type photodiodes formed on the side of a detecting surface that is opposite the incident surface of the semiconductor substrate; (3) and a carrier capturing portion formed between adjacent photodiodes from among the plurality of photodiodes, on the detecting surface side of the semiconductor substrate; (4) wherein the carrier capturing portion has one or a plurality of carrier capturing regions, respectively including pn-junctions, arranged at intervals.

In the above-described semiconductor photodetector having a backside incident type configuration in which the surface opposite the incident surface of the semiconductor substrate becomes the detecting surface, a carrier capturing region including a pn junction is formed between adjacent photodiodes among the plurality of photodiodes. In such a constitution, carriers generated in the vicinity of adjacent photodiodes and about to flow into adjacent photodiodes through diffusion migration are drawn from the carrier capturing region. This eliminates carriers which would flow into the adjacent photodiodes by diffusion migration, and thus can favorably restrain crosstalk from occurring between the photodiodes.

In the backside incident type photodiode array, a photodiode may fall into an electrically floating state when a certain connecting point is damaged because of an initial connection error, a temperature cycle, or the like. In this case, carriers overflowing the photodiode may flow into photodiodes thereabout, thus hindering the latter photodiodes from outputting normal signals. When a certain photodiode falls into an electrically floating state because of a breakage of a connecting point in the above-mentioned semiconductor photodetector, by contrast, carriers which would flow into adjacent photodiodes are drawn from the carrier capturing region. This can favorably restrain carriers from flowing into the adjacent photodiodes.

In the above-described constitution having provided a carrier capturing region comprising a pn junction between adjacent photodiodes, carriers generated between photodiodes or in the vicinity thereof are drawn from the carrier capturing region, whereby crosstalk generation is suppressed, while photosensitivity and obtained signal amount per channel become smaller. By contrast, in the above-described semiconductor photodetector is formed a carrier capturing portion by arranging at intervals one or plurality of carrier capturing regions comprising respective pn junctions. This allows favorably securing the required photosensitivity in the respective photodiodes, while suppressing crosstalk between the photodiodes at the same time.

The present invention provides a radiation detecting apparatus comprising the semiconductor photodetector having the above-described constitution; and a scintillator, positioned on the incident surface side of the semiconductor substrate, for emitting light in response to radiation incident thereon. In such a radiation detecting apparatus, using as a semiconductor photodetector a photodetecting element having the above-described constitution allows favorably suppressing the occurrence of crosstalk between photodiodes, as described above. Also, even when a certain photodiode falls into an electrically floating state because of a breakage of a connecting point, carriers can favorably be restrained from flowing into the adjacent photodiodes. As a result, a high resolution can be attained.

The present invention can provide a semiconductor photodetector and a radiation detecting apparatus which can favorably restrain crosstalk from occurring. The present invention can provide also a semiconductor photodetector and a radiation detecting apparatus in which, even when a certain photodiode falls into an electrically floating state because of a breakage of a connecting point due to an initial connection error, a temperature cycle, etc., carriers are favorably restrained from flowing into adjacent photodiodes.

BRIEF DESCRIPTION OF THE DRAWINGS

FIG. 9 is a diagram illustrating a constitution example of a high-concentration n-type region;

FIG. 10 is a diagram illustrating a constitution example of a photodiode and a carrier capturing portion;

FIG. 11 is a diagram illustrating a constitution example of a photodiode and a carrier capturing portion;

FIG. 12 is a diagram illustrating a constitution example of a photodiode and a carrier capturing portion;

DESCRIPTION OF THE PREFERRED EMBODIMENTS

Figure 1:
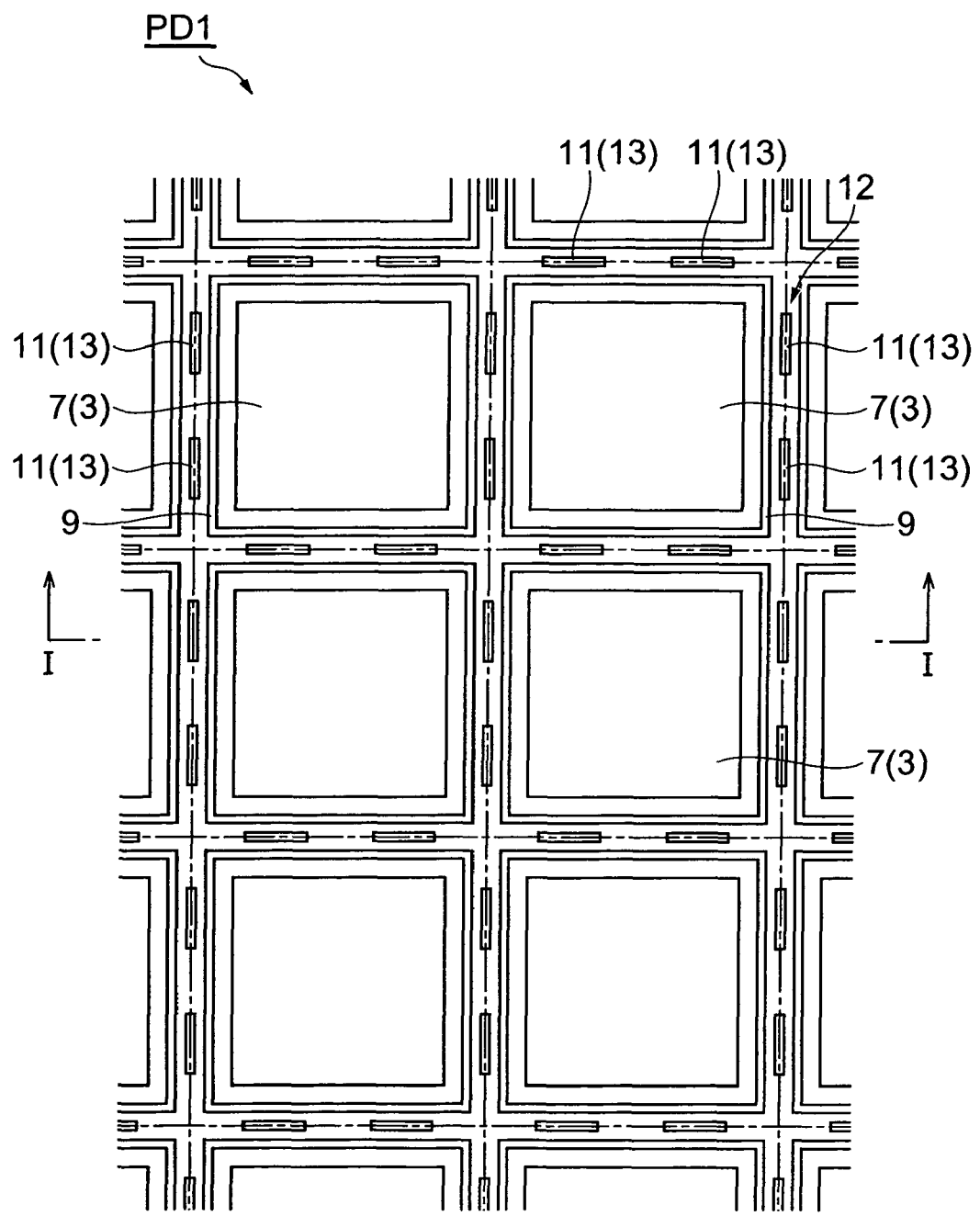
FIG. 1 is a plan-view diagram illustrating schematically the constitution of an embodiment of a semiconductor photodetector.

Preferred embodiments of the semiconductor photodetector and the radiation detecting apparatus according to the present invention are explained in detail below with reference to accompanying drawings. In the explanation of the drawings, constituents identical to each other will be referred to with numerals or letters identical to each other without repeating their overlapping descriptions. It is also noted that dimensional ratios in the drawings do not always agree with those in the description.

Figure 2:
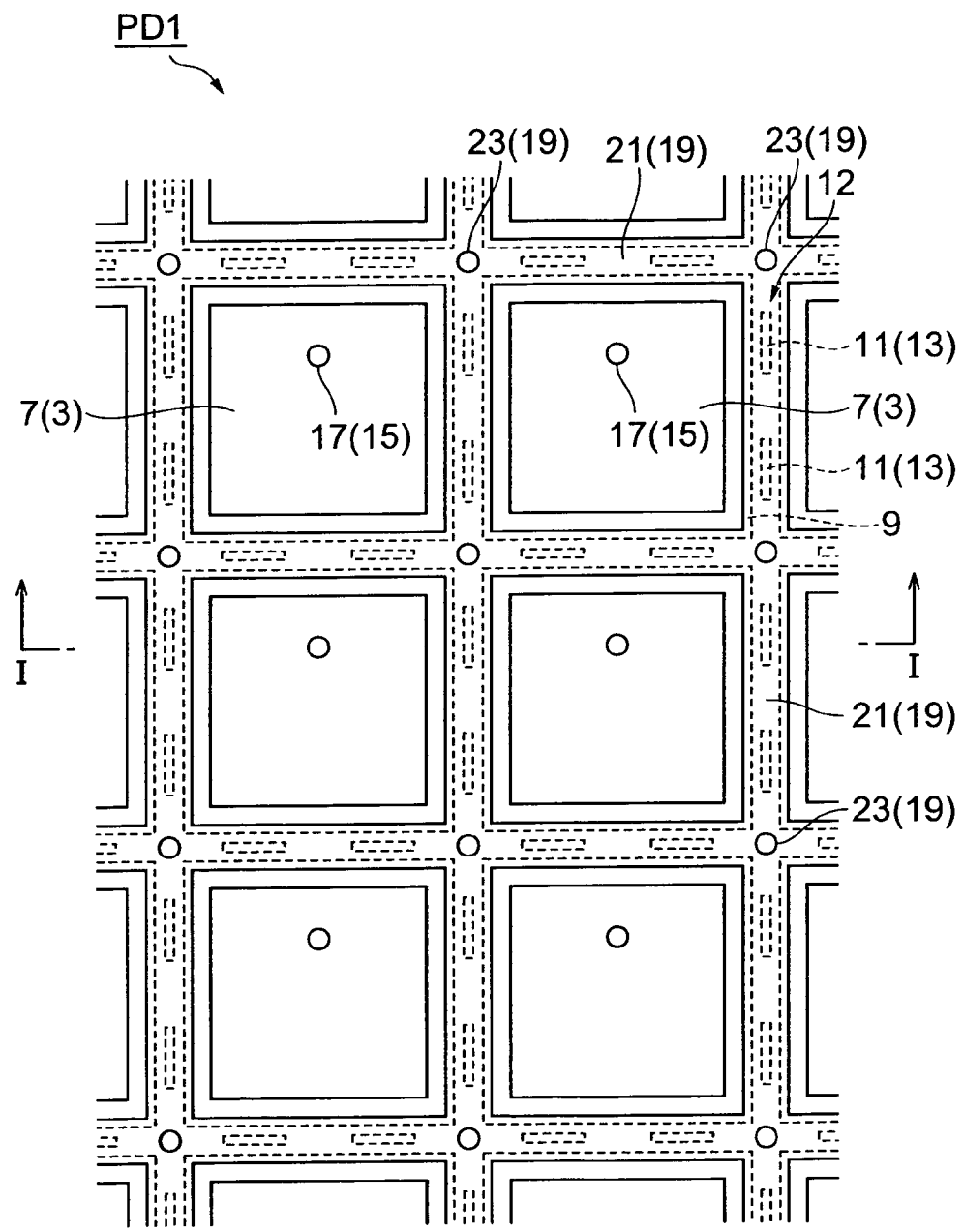
FIG. 2 is a plan-view diagram illustrating schematically the constitution of an embodiment of a semiconductor photodetector.
Figure 3:
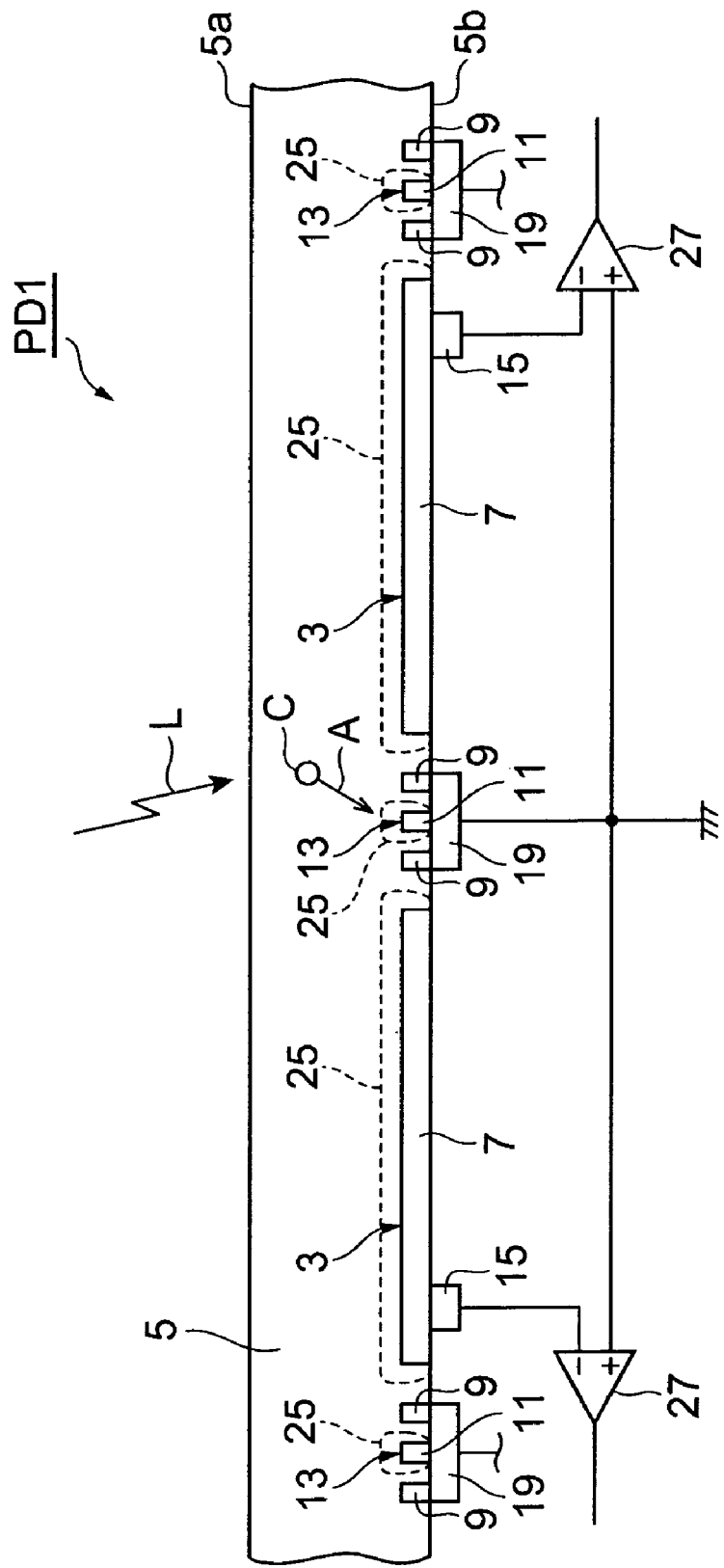
FIG. 3 is a side-view cross-sectional diagram illustrating the cross-sectional constitution of a semiconductor photodetector.

The semiconductor photodetector according to the present invention will be described first. FIGS. 1 and 2 are both plan-view diagrams illustrating schematically the constitution of an embodiment of a semiconductor photodetector according to the present invention. FIG. 3 is a side-view cross-sectional diagram illustrating the cross-sectional constitution of the semiconductor photodetector taken along the line I-I in FIGS. 1 and 2. In the present embodiment, the constitution of a photodiode array PD1 will be described as a constitution example of a semiconductor photodetector according to the present invention. In the explanation below, a first conductive type on the substrate side is taken as an n-type, and another second conductive type is taken as a p-type, although in general the first conductive type may be taken as a p-type and the second conductive type as an n-type.

Here, in the photodiode array PD1, the photodiode array PD1 comprises a semiconductor substrate 5 one face (upper face in FIG. 3) of which is an incident surface 5a of light to be detected L, the other face (lower face in FIG. 3) being a detecting surface 5b on which the photodiodes are formed. FIGS. 1 and 2 are plan-view diagrams where the photodiode array PD1 is viewed from the detecting surface 5b side. FIG. 1 illustrates a plan-view constitution of the photodiode array PD1 in which the below-described electrodes provided on the detecting surface 5b are omitted, while FIG. 2 illustrates a constitution with the electrodes present.

The photodiode array PD1 according to the present embodiment comprises a semiconductor substrate 5, one face of which is the incident surface 5a, and a plurality of pn junction-type photosensitive regions 3 formed on the detecting surface 5b side that is the opposite side to the incident surface 5a of the substrate 5. The semiconductor substrate 5 is an n-type (first conductive type) semiconductor substrate made of silicon (Si), and is for example a silicon substrate with a thickness of 30 to 300 μm (preferably about 100 μm) and an impurity concentration of $1 \times 10^{12}$ to $10^{15}$/cm$^3$.

The plurality of photosensitive regions 3 respectively including pn junctions are arranged as a two-dimensional array on the detecting surface 5b side of the semiconductor substrate 5. In such a constitution, each of the photosensitive regions 3 functions as a photodiode being a photosensitive pixel that makes up the photodiode array PD1.

Specifically, in the n-type semiconductor substrate 5, a plurality of p-type (second conductive type) impurity semiconductor regions 7 are formed and arranged as a two-dimensional array on the detecting surface 5b side. The photosensitive regions 3 that are the photodiodes comprise pn junctions formed by the p-type regions 7 and the n-type semiconductor substrate 5. As the p-type regions 7 are used for example p-type impurity semiconductor regions having an impurity concentration of $1 \times 10^{13}$ to $10^{20}$/cm$^3$, and a depth of 0.05 to 20 μm (preferably about 0.2 μm).

In the present photodiode array PD1 is formed a carrier capturing portion 12 on the detecting surface 5b side of the semiconductor substrate 5, between adjacent photosensitive regions 3 among the plurality of photosensitive regions (photodiodes) 3, i.e., between adjacent p-type regions 7. In the present embodiment, the carrier capturing portion 12 is constituted by the plurality of carrier capturing regions 13, comprising each a pn junction, arranged at intervals. For explanation purposes, the arranging directions of the carrier capturing regions 13 extending along the corresponding sides of the photosensitive regions 3, between adjacent photosensitive regions 3, are depicted in FIG. 1 by dot-dashed lines.

Specifically, on the detecting surface 5b side of the semiconductor substrate 5, there are provided a plurality of p-type regions 11 arranged at intervals between adjacent p-type regions 7 along the above-described arranging directions. The carrier capturing regions (pn junction regions) 13 comprising pn junctions are constituted thus by the pn junctions formed by the p-type regions 11 and the n-type semiconductor substrate 5. As the p-type regions 11 are used for example p-type impurity semiconductor regions having an impurity concentration of $1 \times 10^{13}$ to $10^{20}$/cm$^3$, and a depth of 0.05 to 20 μm (preferably about 0.2 μm).

In the constitution illustrated in FIG. 1, the carrier capturing portion 12 has two carrier capturing regions 13 arranged at intervals between a side of the photosensitive region 3 and a corresponding side of the adjacent photosensitive region 3. In the present embodiment, the carrier capturing portion 12 is formed, for the plurality of photosensitive regions (photodiodes) 3, in such a way that the photosensitive regions 3 are respectively surrounded by the plurality of carrier capturing regions 13 arranged at intervals, as seen from the detecting surface 5b side. Specifically, one photosensitive region 3 as a photodiode is surrounded by a total of eight carrier capturing regions 13, with two carrier capturing regions 13 each on the left side, right side, lower side and upper side of the photosensitive region 3 depicted in FIG. 1.

Also, a high-concentration n-type region (separating layer) 9, as a high-concentration impurity semiconductor region having the same conductive type as the substrate 5, is formed on the detecting surface 5b side of the semiconductor substrate 5 between the above-described carrier capturing portion 12 and the photosensitive region 3 as the photodiode, i.e., between the p-type region 11 and the p-type region 7. Between adjacent photosensitive regions 3, thus, there are provided in sequence a high-concentration n-type region 9, the carrier capturing portion 12 including the carrier capturing regions 13, and a high-concentration n-type region 9, as illustrated in FIG. 1. Herein, the carrier capturing regions 13 of the carrier capturing portion 12 are arranged so as to be sandwiched between the high-concentration n-type regions 9.

The high-concentration n-type region 9 has a function of electrically separating from each other adjacent photodiodes of the photosensitive regions 3. Providing such high-concentration n-type regions 9 allows electrically separating the adjacent photodiodes reliably, thereby lowering crosstalk between the photodiodes and regulating the breakdown voltage (reverse breakdown voltage). As the high-concentration n-type region 9 is used for example an n-type high-concentration impurity semiconductor region having an impurity concentration of $1 \times 10^{13}$ to $10^{20}/cm^3$, and a thickness of 0.1 to several tens of μm (preferably about 3 μm). The thickness of the high-concentration n-type region 9 is preferably larger than the depth of the p-type regions 11 that make up the carrier capturing regions 13.

In the present embodiment, the high-concentration n-type regions 9 are formed for the respective photosensitive regions (photodiodes) 3 such that the photosensitive region 3 is surrounded by the high-concentration n-type region 9 with a continuous region pattern, as seen from the detecting surface 5b side. Herein, the photosensitive region 3 and the corresponding high-concentration n-type region 9 are both surrounded by the plurality of carrier capturing regions 13 arranged at intervals of the carrier capturing portion 12. For the photosensitive regions 3 located at the edge (chip edge) of the semiconductor substrate 5, it is not necessary to form the high-concentration n-type regions 9 and the carrier capturing regions 13 of the carrier capturing portion 12 on the chip edge side, since there are no adjacent photosensitive regions 3 on the chip edge side. If necessary, however, a high-concentration n-type region 9 and/or a carrier capturing region 13 may also be formed on such a chip edge side.

A passivation film and a thermally oxidized film (not depicted) as an electrically insulating film is further formed on the detecting surface 5b that is the front surface of the semiconductor substrate 5. On the incident surface 5a that is the backside of the semiconductor substrate 5 is formed an AR film (not depicted) for protecting the incident surface 5a and suppressing reflection of light L.

In the present embodiment, the incident surface 5a of the semiconductor substrate 5 in the photodiode array PD1 is made substantially flat as illustrated in FIG. 3, although the incident surface 5a is not limited to such a constitution. For example, there may be formed recesses on the regions on the incident surface 5a corresponding to the photosensitive regions 3 existing on the detecting surface 5b side, with protrusions formed around such recesses in such a way so as to surround the regions corresponding to the photosensitive regions 3. In backside incident type configurations, such a constitution allows shortening the distance between the incident surface 5a of the n-type semiconductor substrate 5 and the p-type regions 7 that make up the photosensitive regions 3.

On the detecting surface 5b side of the n-type semiconductor substrate 5 are formed electrodes 15 electrically connected to the p-type regions 7 of the photosensitive regions 3, as illustrated in FIGS. 2 and 3. Each electrode 15 includes an electrode pad, an under-bump metal (UBM), and a bump electrode 17. The electrode pad and UBM are not shown in the figure.

The electrode pad is made of an aluminum film, for example, and is electrically connected to the p-type region 7 through a contact hole formed in the thermally oxidized film. The UBM is formed, for example, by plating an electrode conductor with Ni and Au in succession. The bump electrode 17 is made of solder, and is formed on the UBM.

On the detecting surface 5b side of the n-type semiconductor substrate 5 are formed electrodes 19 electrically connected to the p-type regions 11 of the carrier capturing regions 13 that make up the carrier capturing portion 12, and to the high-concentration n-type regions 9. Each electrode 19 includes an electrode conductor 21, a UBM, and a bump electrode 23. The UBM is not shown in the figure.

The electrode conductor 21 is made of an aluminum film, for example, and is electrically connected to the high-concentration n-type region 9 and p-type region 11 through a contact hole formed in the thermally oxidized film. As is also illustrated in FIGS. 2 and 3, the electrode conductor 21 is formed so as to cover entirely the p-type regions 11 of the carrier capturing regions 13 as well as the high-concentration n-type regions 9 of both sides sandwiching the p-type regions 11, as seen from the detecting surface 5b side of the semiconductor substrate 5. The UBM is formed, for example, by plating the electrode conductor 21 with Ni and Au in succession. The bump electrode 23 is made of solder, and is formed on the UBM. The electrode 19 is connected to a reference potential (for example a ground potential).

In the photodiode array PD1, the anode extraction of each photodiode is realized by the electrode 15, whereas the cathode extraction is realized by the electrode 19. In the photodiode array PD1 are formed depletion layers 25 in the respective boundaries of the pn junctions of the photosensitive regions 3 and the boundaries of the pn junctions of the carrier capturing regions 13.

When the light L to be detected is incident on the photodiode array PD1 from the incident surface 5a side, each photodiode generates a carrier corresponding to the incident light. The photocurrent from the thus generated carrier is taken out from the electrode 15 (bump electrode 17) connected to the p-type region 7 of the photosensitive region 3. As illustrated in FIG. 3, the output from the electrode 15 is connected to the inverting input terminal of a differential amplifier 27. The non-inverting input terminal of the differential amplifier 27 is connected to the reference potential in common with the electrode 19.

As described above, thus, the photodiode array PD1 of the present embodiment illustrated in FIGS. 1 to 3 has a backside incident type configuration in which, as illustrated in FIG. 3, a semiconductor substrate 5 has an incident surface 5a and, on the opposite side thereto, a detecting surface 5b such that carrier capturing regions 13 (p-type regions 11) including pn junctions are formed between adjacent photosensitive regions 3 (p-type regions 7), among a plurality of photosensitive regions 3 as photodiodes, on the detecting surface 5b side of the n-type semiconductor substrate 5.

In such a constitution, even when carriers C occur in the vicinity of the adjacent p-type regions 7, in regions other than the depletion layers 25 in the semiconductor substrate 5, the carriers C that would flow into the adjacent p-type regions 7 of adjacent photosensitive regions 3 by diffusion migration are drawn from the p-type region 11 of the carrier capturing region 13, as indicated by arrow A in FIG. 3. As a result, the carriers C that would flow into the adjacent p-type regions 7 of the photosensitive regions 3 by diffusion migration are captured and eliminated, whereby crosstalk can favorably be restrained from occurring between the photosensitive regions 3.

In addition, a bump connection using bump electrodes may be used for connecting the backside incident type photodiode array PD1, in which the light L is incident on the incident surface 5a of the backside of the substrate, to a support member such as a wiring substrate or the like. In such a configuration using a bump connection, a connecting point may be damaged because of an initial connection error, a temperature cycle, etc., whereby a certain p-type region 7 of the photosensitive region 3 may fall into an electrically floating state.

In the photodiode array PD1 configured as described above, by contrast, even when a certain p-type region 7 falls into an electrically floating state because of a breakage of a connecting point due to an initial connection error, a temperature cycle, etc., carriers overflowing out of the p-type region 7 are drawn from the p-type regions 11 of the carrier capturing regions 13. This can favorably restrain carriers from flowing into the adjacent p-type regions 7. This is also effective in cases employing connecting structures other than the bump connection.

In the above-described constitution having provided carrier capturing regions 13 comprising pn junctions between adjacent photosensitive regions 3 of photodiodes, carriers generated between photosensitive regions 3 or in the vicinity thereof are drawn from the carrier capturing regions 13, whereby crosstalk generation is suppressed while photosensitivity and obtained signal amount per channel become smaller.

By contrast, in the above-described photodiode array PD1 is formed a carrier capturing portion 12 by arranging at intervals one or plurality of carrier capturing regions 13 (preferably a plurality of carrier capturing regions 13) comprising respective pn junctions. In a carrier capturing portion 12 thus constituted, appropriately selecting and setting region patterns such as number, region width, length, interval and the like of the carrier capturing regions 13 formed for the photosensitive regions 3 allows favorably securing the required photosensitivity in the respective photodiodes while suppressing crosstalk generation between the photodiodes.

In the present embodiment, also, the carrier capturing portion 12 is formed in such a way that the photosensitive region 3 of the photodiode is surrounded by the carrier capturing regions 13 arranged at intervals, as seen from the detecting surface 5b side. Herein the carriers C that would flow into the adjacent photosensitive regions 3 are reliably eliminated, which enhances further crosstalk generation suppression. Also, even when a p-type region 7 of a certain photodiode falls into an electrically floating state because of a breakage of a connecting point, carriers overflowing out of the p-type region 7 are drawn from the p-type regions 11 of the carrier capturing regions 13 that surround the p-type region 7. Flow of carriers into adjacent photodiodes can be suppressed even more effectively thereby.

In the present embodiment, also, high-concentration n-type regions 9 are formed between p-type regions 7 and p-type regions 11 on the detecting surface 5b side of the n-type semiconductor substrate 5. As a result, the p-type regions 7 of adjacent photosensitive regions 3 are electrically separated from each other, which allows reducing even further crosstalk between the p-type regions 7. Flow of carriers into adjacent photodiodes can be suppressed yet more effectively thereby, even when a certain photodiode falls into an electrically floating state because of a breakage of a connecting point.

As illustrated in FIG. 1, such high-concentration n-type regions 9 are preferably formed so as to surround the p-type regions 7 of the photosensitive regions 3, as seen from the detecting surface 5b side of the n-type semiconductor substrate 5. This allows electrically separating the adjacent p-type regions 7 reliably.

In the present embodiment, also, electrodes 19 electrically connected to the p-type regions 11 and the high-concentration n-type regions 9 are formed on the detecting surface 5b side of the n-type semiconductor substrate 5, the electrodes 19 being connected to a reference potential. This allows sharing of the electrodes for connecting the p-type regions 11 of the carrier capturing regions 13 to the reference potential, and the electrodes for connecting the high-concentration n-type regions 9 to the reference potential, whereby the number of electrodes can be prevented from increasing. Herein, the carriers C drawn from the p-type regions 11 disappear within the photodiode array PD1.

In the constitution of the photodiode array PD1 according to the present embodiment, the p-type regions 11 of the carrier capturing regions 13 can be formed in the same process as the p-type regions 7 of the photosensitive regions (photodiodes) 3. In this case, the process of making the photodiode array PD1 will not be complicated.

For the constitution of the electrodes provided on the detecting surface 5b side of the semiconductor substrate 5, there may be formed a first electrode electrically connected to a carrier capturing region of the carrier capturing portion, and a second electrode electrically connected to a high-concentration impurity semiconductor region, such that the first electrode and the second electrode are connected to respective reference potentials while being electrically insulated from each other.

In this case, the p-type regions of the carrier capturing regions and the high-concentration n-type regions are electrically separated within the photodiode array. This prevents the potential on the carrier capturing region side from fluctuating, which allows restraining current from flowing in as a result of the potential difference between the photodiodes and the carrier capturing regions. As a result, output signals from photodiodes are less likely to be electrically affected, whereby a stable signal output can be realized.

Figure 4:
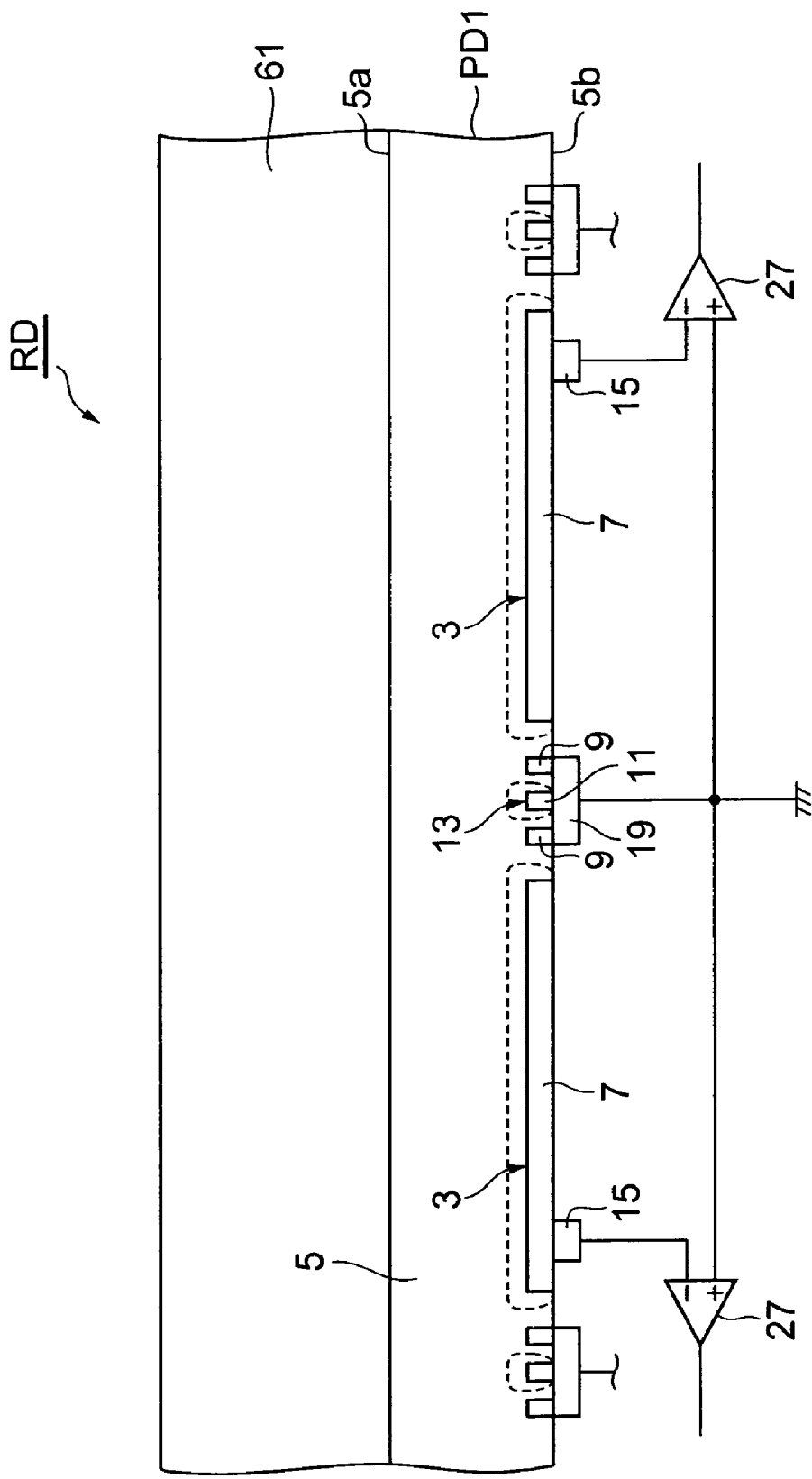
FIG. 4 is a side-view cross-sectional diagram illustrating the cross-sectional constitution of an embodiment of a radiation detecting apparatus.

A radiation detecting apparatus according to the present invention is described next. FIG. 4 is a side-view cross-sectional diagram illustrating schematically the cross-sectional constitution of an embodiment of a radiation detecting apparatus according to the present invention. The radiation detecting apparatus RD according to the present embodiment comprises a scintillator 61 for emitting light in response to radiation incident thereon, and the photodiode array PD1 having the above-described constitution.

The scintillator 61 is arranged on the incident surface 5a side that is the backside of the photodiode array PD1. The light emitted from the scintillator 61 enters the photodiode array PD1, as the semiconductor photodetector, from the incident surface 5a of the semiconductor substrate 5. The scintillator 61 is bonded to the incident surface 5a of the photodiode array PD1. A light-transmitting resin (e.g., epoxy resin or acrylic resin) can be used for bonding the scintillator 61 and the photodiode array PD1 together.

The radiation detecting apparatus RD of the present embodiment comprises the photodiode array PD1 having the constitution illustrated in FIGS. 1 to 3, and hence allows favorably suppressing the occurrence of crosstalk between the p-type regions 7 of adjacent photosensitive regions 3. Also, even when a certain photodiode falls into an electrically floating state because of a breakage of a connecting point due to an initial connection error, a temperature cycle, etc., carriers are favorably restrained from flowing into adjacent photodiodes. As a result, a high resolution can be achieved in radiation detection using the radiation detecting apparatus RD.

The photodiode array illustrated in FIGS. 1 to 3 will be further described with concrete examples and measurement data. In the description given below, the constitution of the semiconductor photodetector is described with a focus on the constitution of the carrier capturing regions 13 (p-type regions 11) of the carrier capturing portion 12 for the photosensitive regions 3 (p-type regions 7) and the effect thereof, and a description of the constitution of the high-concentration n-type regions 9 and so on is omitted.

Figure 5:
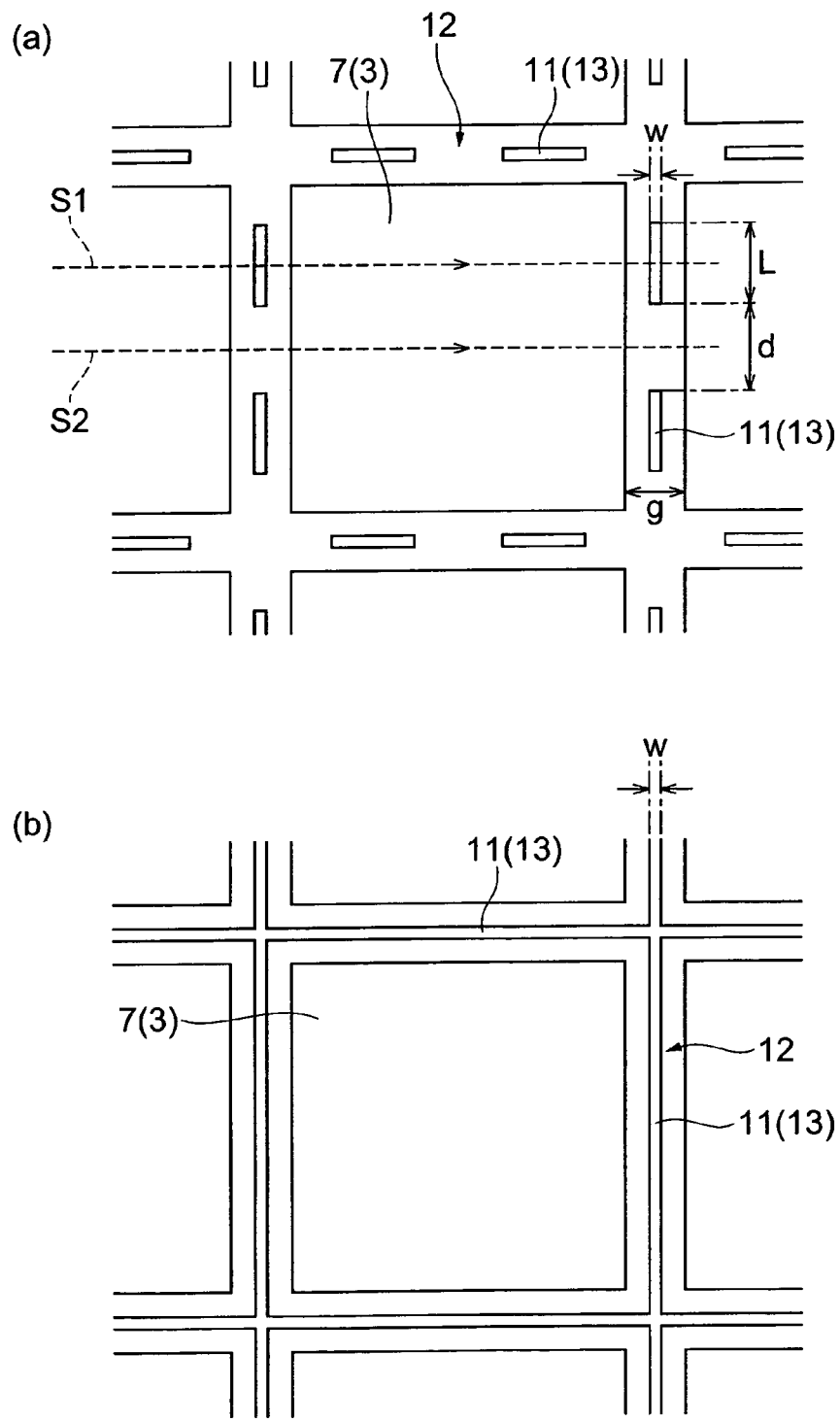
FIG. 5 is a diagram illustrating a constitution example of a photodiode and a carrier capturing portion.

Herein will be studied the effect of constituting a carrier capturing portion 12 with a total of eight carrier capturing regions 13 arranged at intervals for one photosensitive region 3, with two carrier capturing regions 13 on each side of the photosensitive region 3, as illustrated in the constitution example (a) of FIG. 5, which depicts a constitution identical to that of FIG. 1. As a comparative example, the constitution example (b) of FIG. 5 illustrates an assumed constitution in which a carrier capturing region 13 of the carrier capturing portion 12 is formed as a continuous region pattern.

In the constitution of the carrier capturing portion 12 of the present invention as illustrated in the constitution example (a) of FIG. 5, as described above, appropriately selecting and setting the parameters of the region pattern such as region number, region width w, region length L, interval d and the like of the carrier capturing regions 13 that make up the carrier capturing portion 12 allows favorably securing the required photosensitivity in the respective photodiodes, while suppressing crosstalk generation between the photodiodes at the same time. The parameters of the region pattern are preferably set taking into account element characteristics, such as the required photosensitivity, crosstalk, and the like, for the element in question.

More specifically, in the carrier capturing portion 12 having a continuous pattern illustrated in the constitution example (b) of FIG. 5, carriers generated between photosensitive regions 3 or in the vicinity thereof are drawn from the carrier capturing region 13, whereby crosstalk generation between adjacent photodiodes is suppressed. In such a constitution, in addition, carriers such as inflowing carriers from other channels and carriers generated between photodiode pixels (gaps) are drawn by the carrier capturing region 13, whereby the photosensitivity and obtained signal amount per channel of the photodiode become smaller, which in turn may reduce the detection sensitivity (detection sensitivity of radiation in the radiation detecting apparatus) of the light L in the semiconductor photodetector. In a constitution with a carrier capturing portion formed between adjacent photodiodes, therefore, there exists a tradeoff between crosstalk reduction and detection sensitivity enhancement.

In terms of balancing crosstalk reduction and detection sensitivity enhancement, for example, it is possible to consider a finer region width w of the p-type region 11 that make up the carrier capturing region 13 in the constitution example (b) of FIG. 5. Such finer-width p-type regions 11, however, are likely to result in problems such as patterning errors during element manufacture, or saturation of the carrier capturing regions 13.

By contrast, in the photodiode array PD1 of the above-described embodiment is formed a carrier capturing portion 12 for the photosensitive regions 3 by arranging at intervals one or plurality of carrier capturing regions 13 respectively including pn junctions, as illustrated in FIG. 1 and the constitution example (a) of FIG. 5. Such a constitution allows lowering the cross-talk reduction effect in portions where no carrier capturing regions 13 are formed within the carrier capturing portion 12, while increasing the total signal amount. Crosstalk reduction and detection sensitivity enhancement can thereby be favorably balanced.

Increased crosstalk in these portions where no carrier capturing regions 13 are formed can become problematic in case that the light L has a local incident range compared to the pixel size of the photodiode, however, for example, in a constitution where a scintillator 61 is used in combination in the radiation detecting apparatus RD as illustrated in FIG. 4, the light emitted from the scintillator 61 illuminates the entire pixel size, so that the above-described partial crosstalk increase does not pose a problem.

For example, in the structure illustrated in the constitution example (a) of FIG. 5, where the chip thickness of the substrate 5 is 125 μm, the distance between adjacent photosensitive regions (photodiodes) 3 is g=0.2 mm, the region width of the carrier capturing regions 13 is w=15 μm (0.015 mm), the region length is L=0.2 mm and the region interval is d=0.24 mm, sensitivity is about 3% higher than for the continuous structure of the constitution example (b).

Herein, as for the constitution of the carrier capturing regions 13 in the carrier capturing portion 12, the region width w of the carrier capturing regions 13 that constitute the carrier capturing portion 12 is preferably at least 1 μm. The region length L of the carrier capturing regions 13 is preferably at least 1 μm. A carrier capturing portion 12 comprising carrier capturing regions 13 having such a region pattern allows favorably securing the required photosensitivity in the respective photodiodes while suppressing crosstalk generation between the photodiodes. The region width w of the carrier capturing regions 13 that constitute the carrier capturing portion 12 is preferably, in particular, at least 5 μm. The region length L of the carrier capturing regions 13 is preferably, in particular, at least 10 μm.

In the carrier capturing portion 12, the carrier capturing regions 13 are preferably arranged with an interval d such that depletion layers do not come into contact between two adjacent carrier capturing regions 13. In such a constitution, the carrier capturing regions 13 arranged at intervals function reliably as separated regions. This allows reliably achieving the effect of increasing signal amount in the portions between adjacent carrier capturing regions 13 in the arranging direction, where no carrier capturing regions 13 are formed.

The carrier capturing regions 13 in the carrier capturing portion 12 are preferably formed in such a way that the distance from the corresponding photosensitive region 3 of the photodiode to the nearest carrier capturing region 13 (p-type region 11) is smaller than the distance to the adjacent photosensitive regions 3, at all points on the periphery of the photosensitive region 3 (p-type region 7). This allows favorably realizing the carrier capturing portion 12 function for reducing crosstalk over the entirety of the carrier capturing regions 13 arranged at intervals.

Figure 6:
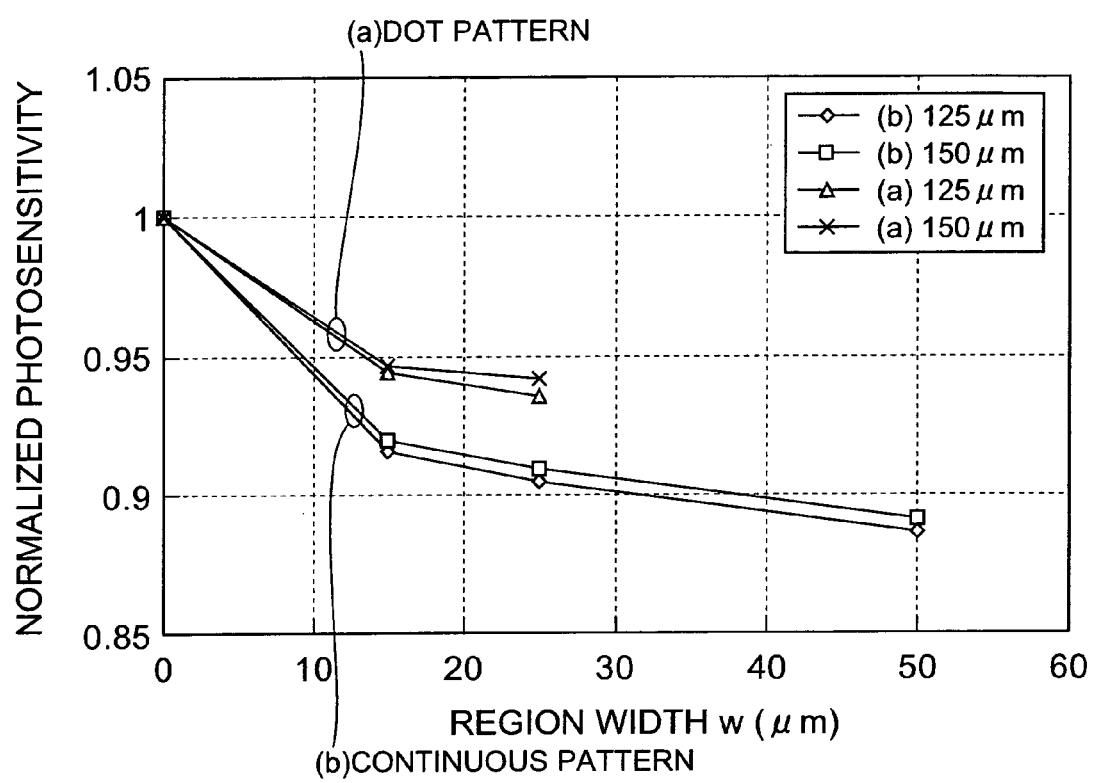
FIG. 6 is a graph illustrating the relationship between the region width of a carrier capturing region in a carrier capturing portion and the photosensitivity of a photodiode.

FIG. 6 is a graph illustrating the relationship between the region width of carrier capturing regions 13 in the carrier capturing portion 12 and the photosensitivity of the photodiodes. In the graph of FIG. 6, the horizontal axis represents the region width w (μm), the vertical axis represents a normalized photosensitivity obtained in the photodiode, the photosensitivity being normalized to 1 when the region width is w=0 μm. A region width w=0 μm is equivalent to no carrier capturing portion being provided.

In FIG. 6 are depicted graphs of two cases, for a chip thickness of 125 μm and of 150 μm, of the dot pattern spaced at intervals of the constitution example (a) illustrated in FIG. 5. In FIG. 6 are also depicted graphs of two cases, for a chip thickness of 125 μm and of 150 μm, of the continuous pattern of the constitution example (b) illustrated in FIG. 5. These graphs show that using the dot pattern structure of the constitution example (a) affords a greater photosensitivity and an enhanced detection sensitivity obtained by the photodiode with the same region width.

Figure 7:
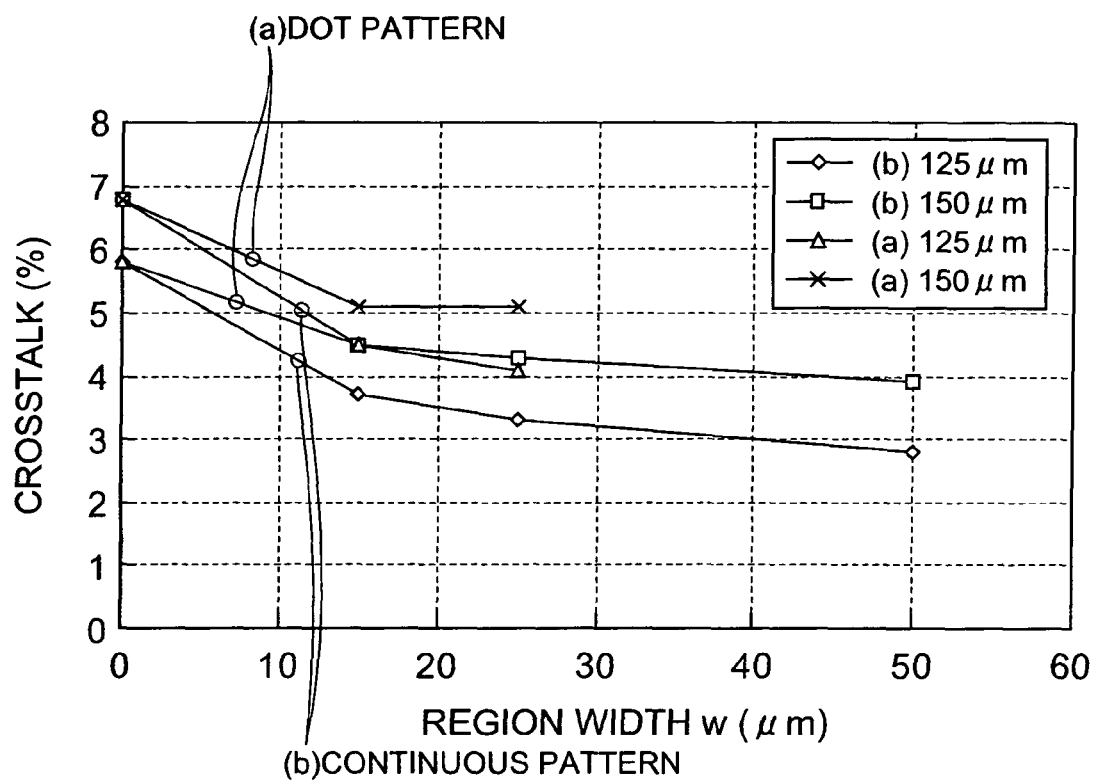
FIG. 7 is a graph illustrating the relationship between the region width of a carrier capturing region in a carrier capturing portion and crosstalk between photodiodes.

FIG. 7 is a graph illustrating the relationship between the region width of carrier capturing regions 13 in the carrier capturing portion 12 and crosstalk between photodiodes. In FIG. 7 the horizontal axis represents the region width w (μm) and the vertical axis represents crosstalk (%) between photodiodes.

In FIG. 7, as in FIG. 6, are depicted graphs of two cases, for a chip thickness of 125 μm and of 150 μm, of the dot pattern spaced at intervals of the constitution example (a) illustrated in FIG. 5. In FIG. 7 are also depicted graphs of two cases, for a chip thickness of 125 μm and of 150 μm, of the continuous pattern of the constitution example (b) illustrated in FIG. 5. As these graphs show, although carrier capturing regions adopting the non-continuous dot pattern afford a somewhat smaller crosstalk reduction effect compared to the continuous pattern, they do afford a sufficient crosstalk reduction effect as compared with conventional structures where no carrier capturing portion is provided.

Figure 8:
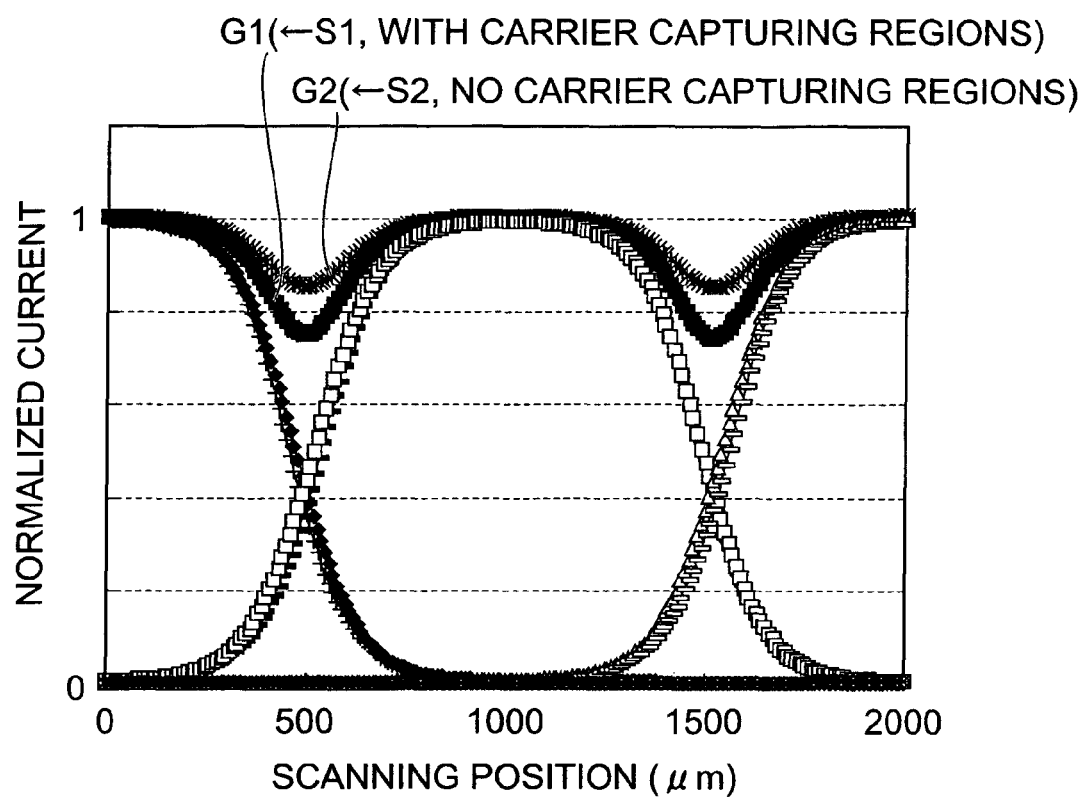
FIG. 8 is a graph illustrating the signal amount obtained at each position of a photodiode array.

FIG. 8 is a graph illustrating the signal amount obtained at each position of the photodiode array. In FIG. 8, the horizontal axis represents the scanning position (μm) along a predetermined scanning direction in the photodiode array, and the vertical axis represents a normalized current i.e. signal amount obtained at each position, the current being normalized taking as 1 the maximum value of the below-described graph G2. In FIG. 8, the graph G1 depicts the current value change along the scanning direction S1 (including the carrier capturing regions 13), while the graph G2 depicts the current value change along the scanning direction S2 (not including the carrier capturing regions 13), in the constitution example (a) of FIG. 5. The other graphs illustrate current values obtained in each photodiode prior to addition.

As these graphs show, crosstalk capturing and drawing effects between photodiodes are also achieved in graph G2 obtained for the scanning direction S2 where no carrier capturing regions 13 are formed, although somewhat less effectively than in graph G1 for the scanning direction S1 where carrier capturing regions 13 are formed. The antiblooming effect by the carrier capturing portion 12 can be reliably achieved by using a constitution wherein, as described above, the distance to the nearest carrier capturing region 13 (p-type region 11) is smaller than the distance to the adjacent photosensitive region 3, at all points on the periphery of the photosensitive region 3 (p-type region 7).

In the constitution example (a) of FIG. 5, the high-concentration n-type regions 9 formed between the p-type regions 7 of the photosensitive regions 3 and the p-type regions 11 of the carrier capturing regions 13 can be formed to various patterns in accordance with the constitution of the carrier capturing portion 12, as illustrated for example schematically with dashed lines in the constitution examples (a) and (b) of FIG. 9. The constitution example (a) of FIG. 9 corresponds herein to the constitution illustrated in FIG. 1.

Herein, various concrete constitutions other than the above-described constitutions can be used also as specific region patterns of the carrier capturing regions 13 of the carrier capturing portion 12, for example those illustrated in FIGS. 10 to 12. These FIGS. 10 to 12 depict only the constitutions of the photosensitive regions 3 (p-type regions 7) and of the carrier capturing regions 13 (p-type regions 11), omitting the constitutions of the high-concentration n-type regions 9 and so forth.

In the constitution example (a) of FIG. 10 is illustrated a carrier capturing portion 12 comprising four carrier capturing regions 13 surrounding the photosensitive region 3, one at each side, left, right, bottom and top of the photosensitive region 3 of the photodiode. In the constitution example (b) of FIG. 10, the number of carrier capturing regions 13 is the same as in the constitution example (a), but whereas in the constitution example (a) the carrier capturing region 13 is provided for a central portion of the corresponding side of the photosensitive region 3, in the constitution example (b) the carrier capturing region 13 is provided over the entirety of the corresponding side of the photosensitive region 3, with intervals at the corner sections of the photosensitive region 3, where the carrier capturing regions are not provided.

In the constitution example (a) of FIG. 11, cross-shaped carrier capturing regions 13 corresponding to the corner sections of the photosensitive region 3 are provided in addition to the carrier capturing regions 13 in the constitution example (a) of FIG. 10. In the constitution example (b) of FIG. 11, the carrier capturing regions provided at the central portions of each side of the photosensitive region 3 are absent, so that the carrier capturing portion 12 comprises only cross-shaped carrier capturing regions 13 extending from the corner sections of the photosensitive region 3.

In the constitution example (a) of FIG. 12, the region pattern of the carrier capturing regions 13 in the carrier capturing portion 12 is a fine dot pattern. In the constitution example (b) of FIG. 12, the carrier capturing regions 13 are alternately arranged in two parallel arranging directions running between adjacent photosensitive regions 3, and in which the arranging positions for the carrier capturing regions 13 are shifted relative to one another.

For the constitution of the electrodes provided on the detecting surface 5b side of the semiconductor substrate 5, as described above, there may be formed a first electrode electrically connected to the carrier capturing regions 13 of the carrier capturing portion 12, and a second electrode electrically connected to the high-concentration n-type regions 9, such that the first electrode and the second electrode are respectively connected to reference potentials while being electrically insulated from each other.

Figure 13:
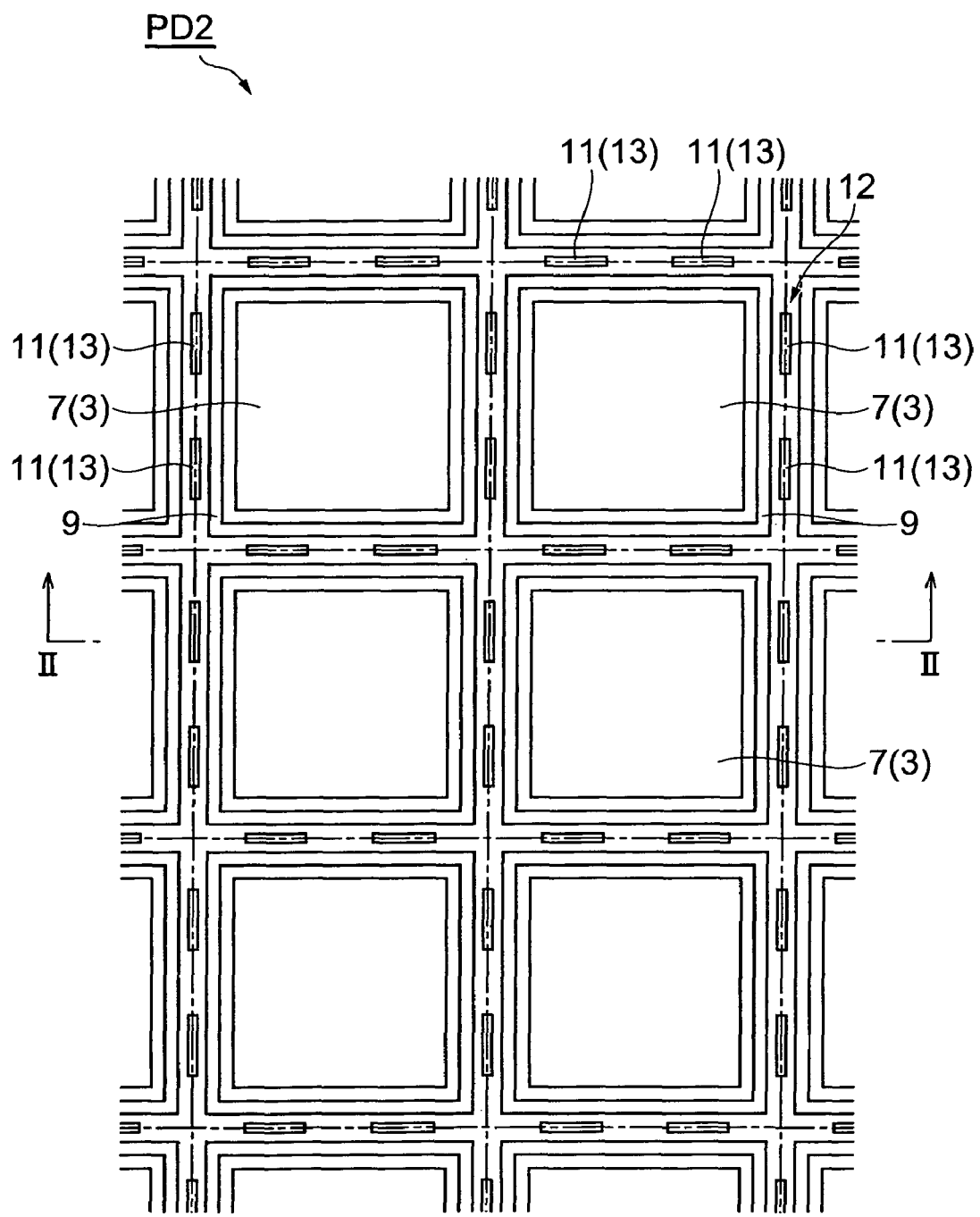
FIG. 13 is a plan-view diagram illustrating schematically the constitution of another embodiment of a semiconductor photodetector.
Figure 14:
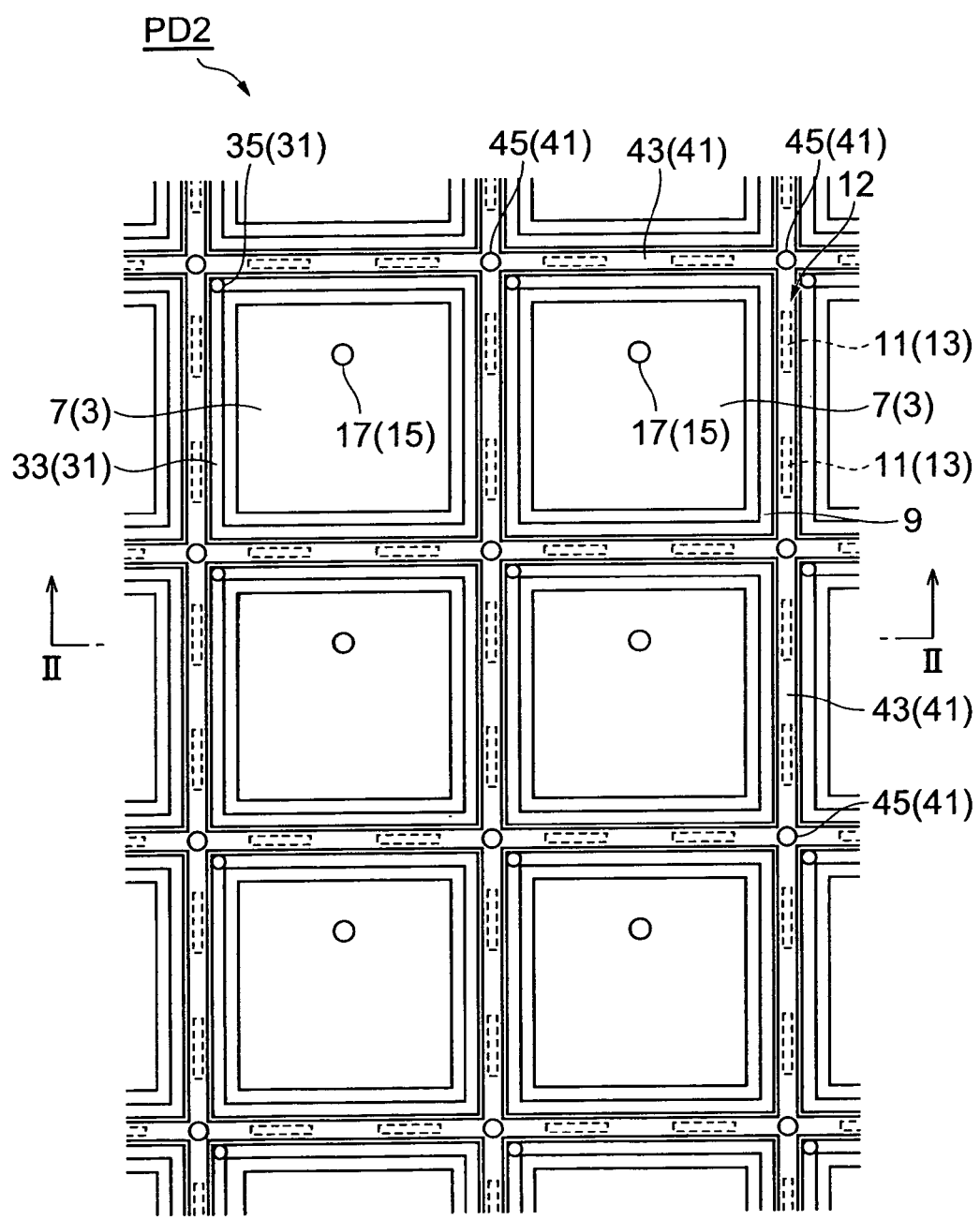
FIG. 14 is a plan-view diagram illustrating schematically the constitution of another embodiment of a semiconductor photodetector.
Figure 15:
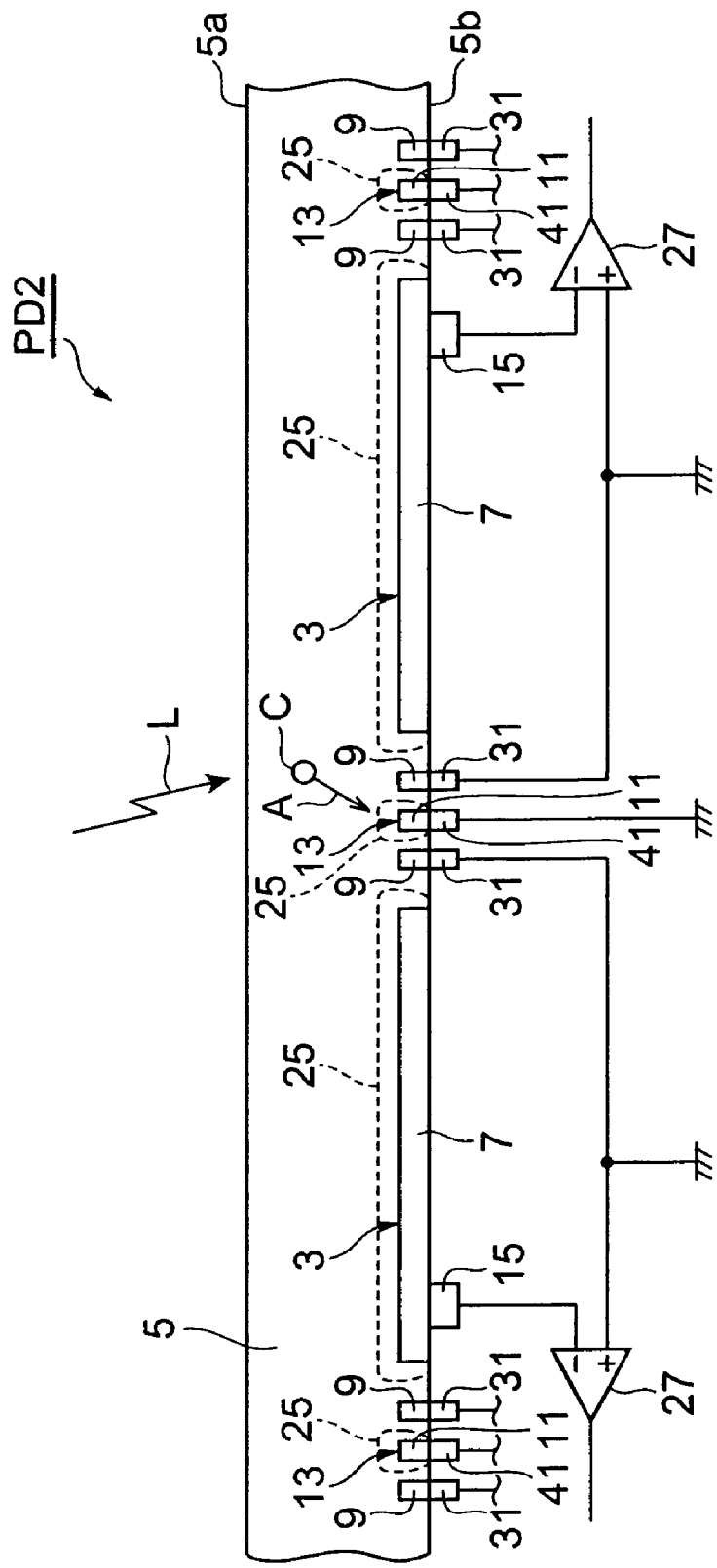
FIG. 15 is a side-view cross-sectional diagram illustrating the cross-sectional constitution of a semiconductor photodetector.

The semiconductor photodetector having the above electrode constitution will be described with reference to FIGS. 13 to 15. FIGS. 13 and 14 are both plan-view diagrams illustrating schematically the constitution of another embodiment of a semiconductor photodetector according to the present invention. FIG. 15 is a side-view cross-sectional diagram illustrating the cross-sectional constitution of the semiconductor photodetector of FIGS. 13 and 14 taken along the line II-II. In the present embodiment, the constitution of a photodiode array PD2 will be described as another example of the constitution of a semiconductor photodetector according to the present invention.

On the detecting surface 5b side of the n-type semiconductor substrate 5 of the present photodiode array PD2, there are formed electrodes 31, being second electrodes electrically connected to the high-concentration n-type regions 9. Each electrode 31 includes an electrode conductor 33, a UBM and a bump electrode 35.

The electrode conductor 33 is made of an aluminum film, for example, and is electrically connected to the high-concentration n-type region 9 through a contact hole formed in a thermally oxidized film. As shown in FIGS. 14 and 15, the electrode conductor 33 is formed so as to cover the high-concentration n-type region 9 as seen from the detecting surface 5b side of the semiconductor substrate 5. The UBM is formed, for example, by plating the electrode conductor 33 with Ni and Au in succession. The bump electrode 35 is made of solder, and is formed on the UBM.

The electrode 31 is connected to the non-inverting input terminal of a differential amplifier 27, whereas a middle part of a lead between the electrode 31 and the non-inverting input terminal of the differential amplifier 27 is connected to a reference potential (for example a ground potential). Therefore, the electrode 31 and the non-inverting input terminal of the differential amplifier 27 are connected to a common reference potential.

On the detecting surface 5b side of the n-type semiconductor substrate 5, there are formed electrodes 41, being first electrodes electrically connected to the p-type regions 11 of the carrier capturing regions 13. Each electrode 41 includes an electrode conductor 43, a UBM, and a bump electrode 45.

The electrode conductor 43 is made of an aluminum film, for example, and is electrically connected to the p-type region 11 of the carrier capturing region 13 through a contact hole formed in the thermally oxidized film. As shown in FIGS. 14 and 15, the electrode conductor 43 is formed so as to cover the carrier capturing portion 12 where the p-type regions 11 are arranged, as seen from the detecting surface 5b side of the semiconductor substrate 5. The UBM is formed, for example, by plating the electrode conductor 43 with Ni and Au in succession. The bump electrode 45 is made of solder, and is formed on the UBM.

The electrodes 41 are electrically insulated from the electrodes 31. While being electrically insulated from the electrodes 31, the electrodes 41 are connected to a reference potential (for example, a ground potential) different from that for the electrodes 31 on the outside of the photodiode array PD2.

In the electrode constitution illustrated in FIGS. 13 to 15, the p-type regions 11 of the carrier capturing regions 13 and the high-concentration n-type regions 9 are electrically separated inside the photodiode array PD2. This prevents the potential on the carrier capturing region 13 side from fluctuating, which allows restraining current from flowing in as a result of the potential difference between the photosensitive regions 3 of the photodiodes and the carrier capturing regions 13. As a result, output signals from photodiodes are less likely to be electrically affected, whereby a stable signal output can be realized. Apart from those described above, various other constitutions may be used as the electrode constitutions.

The semiconductor photodetector and radiation detecting apparatus according to the present invention are not limited to the above-described embodiments and constitution examples, and may be subject to various modifications. For example, in the above constitution examples, the present invention is used in photodiode arrays where a plurality of pn junction-type photodiodes are arranged in a two-dimensional array, however, the invention is not limited thereto, and can also be suitably used in photodiode arrays where a plurality of photodiodes are arranged in a one-dimensional array, for example. The semiconductor photodetector and radiation detecting apparatus according to the present invention can also be suitably used in X-ray CT apparatuses.

The present invention can provide a semiconductor photodetector and a radiation detecting apparatus which can favorably restrain crosstalk from occurring.

The semiconductor photodetector according to the above embodiment comprises (1) a semiconductor substrate, one face of which is an incident surface of light to be detected; (2) a plurality of pn junction-type photodiodes formed on the side of a detecting surface that is the opposite surface to the incident surface of the semiconductor substrate; and (3) a carrier capturing portion formed between adjacent photodiodes among the plurality of photodiodes, on the detecting surface side of the semiconductor substrate; (4) wherein the carrier capturing portion has one or a plurality of carrier capturing regions, respectively including pn-junctions, arranged at intervals.

The carrier capturing portion is preferably formed in such a way that at least one photodiode among the plurality of photodiodes is surrounded by the plurality of carrier capturing regions arranged at intervals, as seen from the detecting surface side. In this case, the carriers that would flow into adjacent photodiodes are reliably removed, which allows suppressing crosstalk generation more favorably. Flow of carriers into adjacent photodiodes can be suppressed yet more effectively thereby, even when a certain photodiode falls into an electrically floating state because of a breakage of a connecting point.

Also, a high-concentration impurity semiconductor region having the same conductivity type as the semiconductor substrate is preferably formed on the detecting surface side of the semiconductor substrate, between the carrier capturing portion and the photodiode. The high-concentration impurity semiconductor region has herein a function of separating adjacent photodiodes (channel stopper), for electrically separating adjacent photodiodes. Crosstalk between photodiodes can be further reduced as a result. Flow of carriers into adjacent photodiodes can be suppressed yet more effectively thereby, even when a certain photodiode falls into an electrically floating state because of a breakage of a connecting point.

The high-concentration impurity semiconductor region is preferably formed so as to surround at least one photodiode among the plurality of photodiodes, as seen from the detecting surface side. Adjacent photodiodes can then be electrically separated reliably.

In the electrode constitution for the carrier capturing portion and the like, an electrode is preferably formed on the detecting surface side of the semiconductor substrate, the electrode being electrically connected to the carrier capturing region of the carrier capturing portion and to the high-concentration impurity semiconductor region, the electrode being connected to a reference potential. This allows sharing of the electrodes for connecting the carrier capturing regions to the reference potential, and the electrodes for connecting the high-concentration impurity semiconductor regions to the reference potential, whereby the number of electrodes can be prevented from increasing. The carries drawn from the carrier capturing regions disappear inside the semiconductor photodetector. Crosstalk between photodiodes can be reduced as a result. Flow of carriers into adjacent photodiodes can be reduced thereby, even when a certain photodiode falls into an electrically floating state because of a breakage of a connecting point.

In the constitution of the electrodes, there may be formed a first electrode electrically connected to the carrier capturing region of the carrier capturing portion, and a second electrode electrically connected to the high-concentration impurity semiconductor region on the detecting surface side of the semiconductor substrate, such that the first electrode and the second electrode are respectively connected to reference potentials while being electrically insulated from each other. In this case, the carrier capturing regions and the high-concentration impurity semiconductor regions are electrically separated inside the semiconductor photodetector. This prevents the potential on the carrier capturing region side from fluctuating, which allows restraining current from flowing in because of the potential difference between the photodiodes and the carrier capturing regions. As a result, output signals from photodiodes are less likely to be electrically affected, whereby a stable signal output can be realized.

Preferably, the semiconductor substrate is of a first conductive type, whereas the plurality of photodiodes and the one or plurality of carrier capturing regions comprise each a second conductive type impurity semiconductor region and the semiconductor substrate. Preferably, the high-concentration impurity semiconductor region is of the first conductive type, as is the semiconductor substrate.

In the constitution of the carrier capturing portion in which are arranged one or plurality of carrier capturing regions respectively including pn junctions, the region width w of the carrier capturing regions that constitute the carrier capturing portion is preferably no less than 1 µm. The region length L of the carrier capturing regions is preferably no less than 1 µm. A carrier capturing portion having such a region pattern allows favorably securing the required photosensitivity in the respective photodiodes, while suppressing crosstalk generation between the photodiodes at the same time, as described above.

In the carrier capturing portion, the carrier capturing regions are preferably arranged with an interval such that depletion layers do not come into contact between two adjacent carrier capturing regions. In addition, in the carrier capturing portion, the carrier capturing regions are preferably formed in such a way that a distance from the corresponding photodiode to the carrier capturing regions is smaller than a distance to the adjacent photodiodes, at all points on the periphery of the photodiode. Such constitutions allow favorably securing the required photosensitivity in the respective photodiodes while suppressing crosstalk generation between the photodiodes, as described above.

In the radiation detecting apparatus according to the above embodiment there can be used a constitution comprising a semiconductor photodetector having the above-described constitution and a scintillator positioned on the incident surface side of the semiconductor substrate, for emitting light in response to radiation incident thereon. In such a radiation detecting apparatus, using as a semiconductor photodetector a photodetecting element having the above-described constitution allows favorably suppressing the occurrence of crosstalk between photodiodes, as described above. Flow of carriers into adjacent photodiodes can be suppressed thereby, even when a certain photodiode falls into an electrically floating state because of a breakage of a connecting point. A high resolution can be attained as a result.

What is claimed is:

1. A semiconductor photodetector, comprising:
   a semiconductor substrate of a first conductive type, one side of said substrate exposed to incident light to be detected;
   a plurality of pn junction-type photodiodes formed on a side of a detecting surface that is opposite to said incident surface of said semiconductor substrate; and
   a carrier capturing portion formed between adjacent photodiodes from among said plurality of photodiodes, on said detecting surface side of said semiconductor substrate, wherein
   said carrier capturing portion has a plurality of carrier capturing regions, respectively including pn-junctions, arranged at intervals, and wherein
   said carrier capturing portion has, at least for one photodiode among said plurality of photodiodes, at least two carrier capturing regions, between one side of the one photodiode and a corresponding side of an adjacent photodiode facing the one side of the one photodiode, arranged at intervals along an arranging direction parallel to the one side of the one photodiode,
   each of said plurality of photodiodes comprises a second conductive type impurity semiconductor region,
   each of said plurality of carrier capturing regions including at least the two carrier capturing regions comprises a second conductive type carrier capturing impurity semiconductor region, and
   the second conductive type carrier capturing impurity semiconductor regions adjacent each other, corresponding to the carrier capturing regions adjacent each other, are separated by a first conductive type substrate region which is a part of the semiconductor substrate and is provided between the second conductive type carrier capturing impurity semiconductor regions.

2. The semiconductor photodetector as claimed in claim 1, wherein said carrier capturing portion has, at least for the one photodiode among said plurality of photodiodes,
   at least two left-side carrier capturing regions, between a left side of the one photodiode and a corresponding side of a left-side adjacent photodiode, arranged at intervals along an arranging direction parallel to the left side of the one photodiode,
   at least two right-side carrier capturing regions, between a right side of the one photodiode and a corresponding side of a right-side adjacent photodiode, arranged at intervals along an arranging direction parallel to the right side of the one photodiode,
   at least two lower-side carrier capturing regions, between a lower side of the one photodiode and a corresponding side of a lower-side adjacent photodiode, arranged at intervals along an arranging direction parallel to the lower side of the one photodiode, and
   at least two upper-side carrier capturing regions, between an upper side of the one photodiode and a corresponding side of an upper-side adjacent photodiode, arranged at intervals along an arranging direction parallel to the upper side of the one photodiode.

3. The semiconductor photodetector as claimed in claim 1, wherein a high-concentration impurity semiconductor region having the same conductive type as said semiconductor substrate is formed, on said detecting surface side of said semiconductor substrate, between said carrier capturing portion and said photodiode,
   wherein said semiconductor substrate and said high-concentration impurity semiconductor region are of the first conductive type, each of said plurality of photodiodes comprises the second conductive type impurity semiconductor region, and each of said plurality of carrier capturing regions comprises the second conductive type carrier capturing impurity semiconductor region.

4. The semiconductor photodetector as claimed in claim 3, wherein said high-concentration impurity semiconductor region is formed so as to surround at least the one photodiode among said plurality of photodiodes, as seen from said detecting surface side.

5. The semiconductor photodetector as claimed in claim 3, wherein an electrode is formed on said detecting surface side of said semiconductor substrate, the electrode being electrically connected to said plurality of carrier capturing regions of said carrier capturing portion and to said high-concentration impurity semiconductor region, and wherein said electrode is connected to a reference potential.

6. The semiconductor photodetector as claimed in claim 3, wherein a first electrode electrically connected to said plurality of carrier capturing regions of said carrier capturing portion, and a second electrode electrically connected to said high-concentration impurity semiconductor region, are formed on said detecting surface side of said semiconductor substrate, and wherein said first electrode and said second electrode are respectively connected to reference potentials while being electrically insulated from each other.

7. The semiconductor photodetector as claimed in claim 1, wherein a region width w of each of said plurality of carrier capturing regions constituting said carrier capturing portion is at least 1 µm.

8. The semiconductor photodetector as claimed in claim 1, wherein a region length L of each of said plurality of carrier capturing regions constituting said carrier capturing portion is at least 1 µm.

9. The semiconductor photodetector as claimed in claim 1, wherein said carrier capturing regions in said carrier capturing portion are arranged with an interval such that depletion layers do not come into contact between two adjacent carrier capturing regions.

10. The semiconductor photodetector as claimed in claim 1, wherein said carrier capturing regions in said carrier capturing portion are formed such that a distance from the corresponding photodiode to the carrier capturing regions is smaller than a distance to the adjacent photodiodes, at all points on a periphery of the photodiode.

11. A radiation detecting apparatus, comprising:
the semiconductor photodetector according to claim 1; and
a scintillator, positioned on the incident surface side of the semiconductor substrate, emitting light in response to radiation incident thereon.

* * * * *